United States Patent
Madsen et al.

(10) Patent No.: US 6,538,452 B2
(45) Date of Patent: Mar. 25, 2003

(54) DEVICE FOR TESTING COAXIAL CONNECTORS

(75) Inventors: Dale Madsen, Jordan, MN (US); Amy Witty, Prior Lake, MN (US)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 09/803,648

(22) Filed: Mar. 9, 2001

(65) Prior Publication Data

US 2002/0125894 A1 Sep. 12, 2002

(51) Int. Cl.[7] .............................................. H01H 31/04

(52) U.S. Cl. ...................................... 324/538; 324/542

(58) Field of Search ................................ 439/587, 589; 33/836; 324/538, 542; 174/65 R

(56) References Cited

U.S. PATENT DOCUMENTS

| | | | |
|---|---|---|---|
| 2,810,881 A | * 10/1957 | Daily | 324/542 |
| 3,378,764 A | * 4/1968 | Peltz | 324/538 |
| 3,613,048 A | * 10/1971 | Brundza | 439/589 |
| 4,553,085 A | 11/1985 | Canzano | 324/51 |
| 4,929,902 A | * 5/1990 | Nelson, III | 324/542 |
| 5,043,536 A | * 8/1991 | DeBartolo, Jr. | 174/65 R |
| 5,187,875 A | * 2/1993 | Kuehling | 33/836 |
| 5,241,277 A | * 8/1993 | Kefalas | 324/538 |
| 5,565,784 A | 10/1996 | DeRenne | 324/527 |
| 5,704,809 A | * 1/1998 | Davis | 439/578 |
| 5,741,146 A | 4/1998 | Henry et al. | 439/188 |
| 5,769,662 A | 6/1998 | Stabile et al. | 439/578 |
| 6,099,334 A | 8/2000 | Togashi | 439/188 |
| 6,344,748 B1 | * 2/2002 | Gannon | 324/542 |

FOREIGN PATENT DOCUMENTS

EP 0 277 035 1/1888 ........... H01R/17/12

OTHER PUBLICATIONS

IBM Technical Disclosure Bulletin, NB8406665, v. 27, 1B, pp 665–666, (Jun. 1984).*
RZX–3 Rear Cross–Connect Products, ADCTelecommunications, Jul. 1998, pp. 5,6,27,28.
Video Signal Distribution Products, ADCTelecommunications, Oct. 1996, pp. 8–9.
Components—Longframe Jacks, ADCTelecommunications, Jun. 1998, pp. 22,30,31,36,52,53,105,112,113,115,118,119, 120,121.
Enteraprise 5000E Multimedia Outlets, ADCTelecommunications, Oct. 1998, p.1
HWX Receiver Modules Forward Path and Dual Return Path Receivers, ADCTelecommunications, Dec. 1998, pp. 2–5 with Ordering Information.
DV6000 Universal Digital Transmission System, ADC Video Systems.
DV6000 DVFE Fast EtherRing Switch 10Base–T and 100 Base–TX/FX, ADCTelecommunications, Dec. 1998, pp.2–5 with Ordering Information.
FL2000 System —Fiber Optic Components Bulkhead Adapters, ADCTelecommunications, Nov. 1996, p. 40.
BNC Tester (010–0133) Combines Two Functions in Single Unit, www.trompeter.com (Aug. 2001).
RF Coaxial Connectors, 1.6/5.6 ITT Cannon, p. 58, (no date).

* cited by examiner

Primary Examiner—Christine K. Oda
(74) Attorney, Agent, or Firm—Merchant & Gould

(57) ABSTRACT

A testing device provides pin height, continuity, and concentricity testing for coaxial connectors and cables. The testing device provides connector jacks with support shafts that properly align and stabilize the connectors during testing. Circuitry is provided to indicate if the pin height is sufficient, if the cable is an open circuit, a short circuit, or has an adequate continuity, and if the center pin of the connector is sufficiently concentric with the outer sleeve. The jacks may have an outer surface with slots providing a slip fit configuration that allows the coaxial connector to be easily inserted and removed.

28 Claims, 17 Drawing Sheets

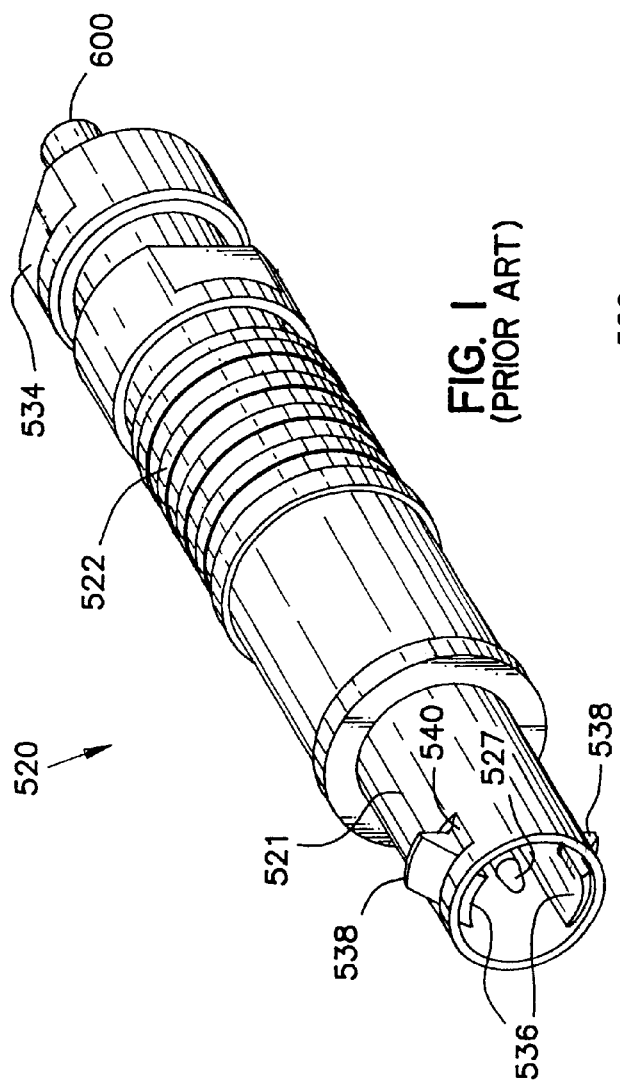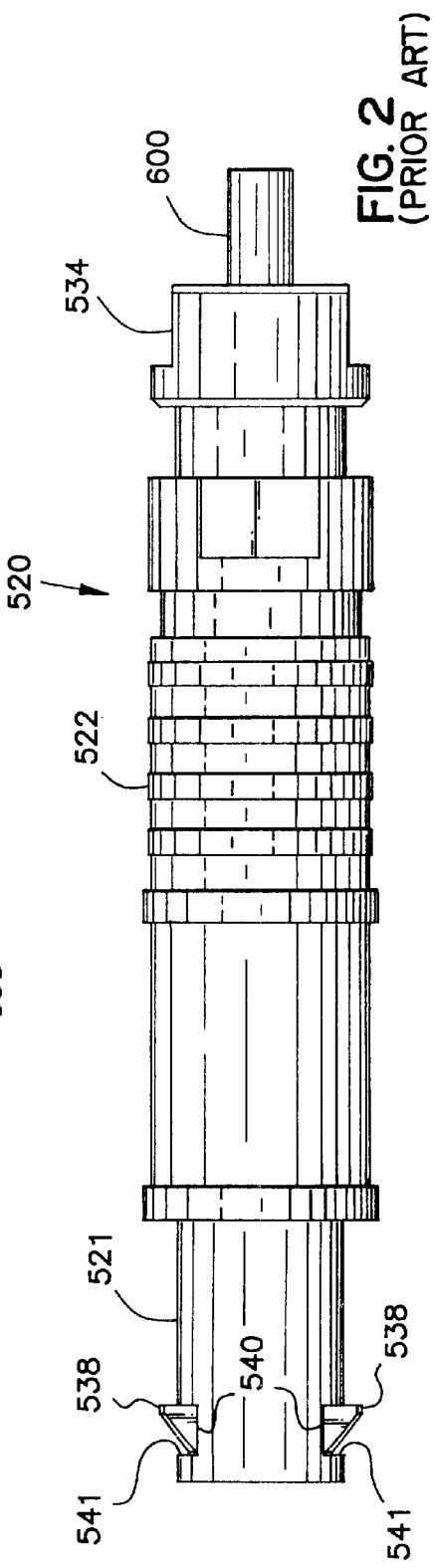

FIG. 6A
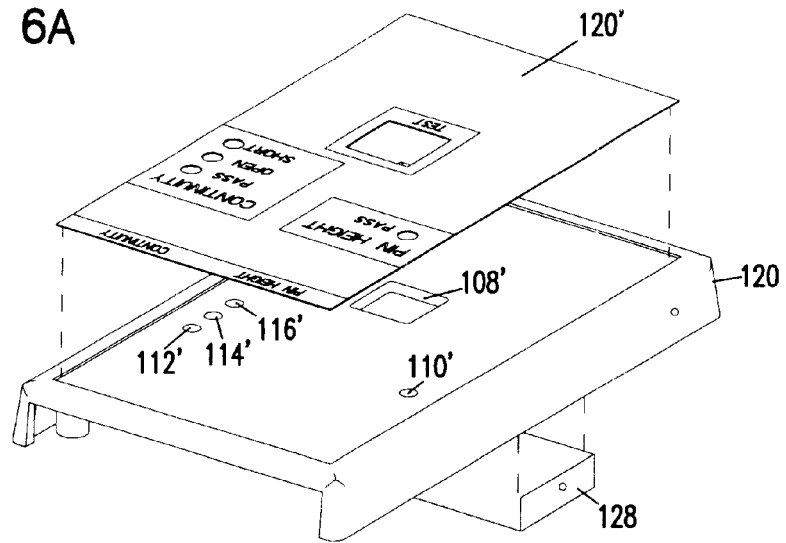
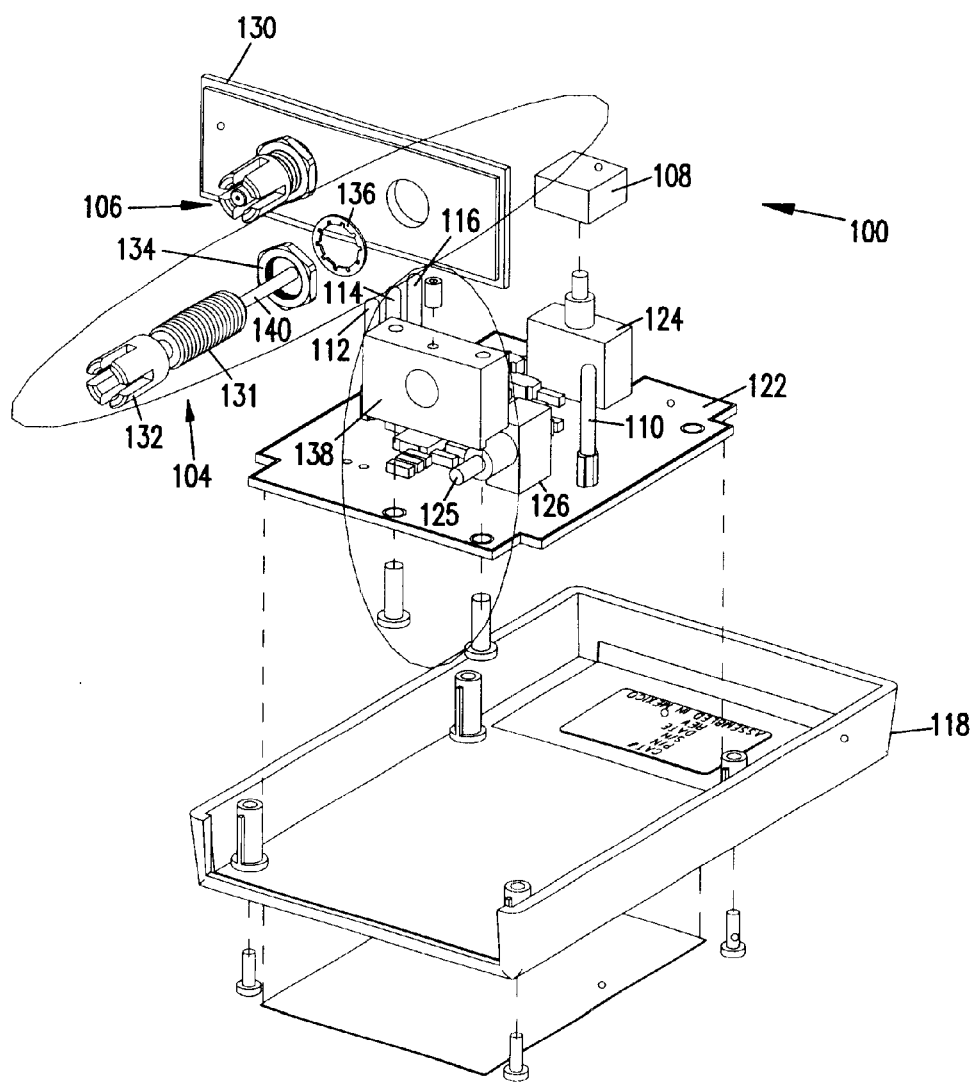

FIG. 6B
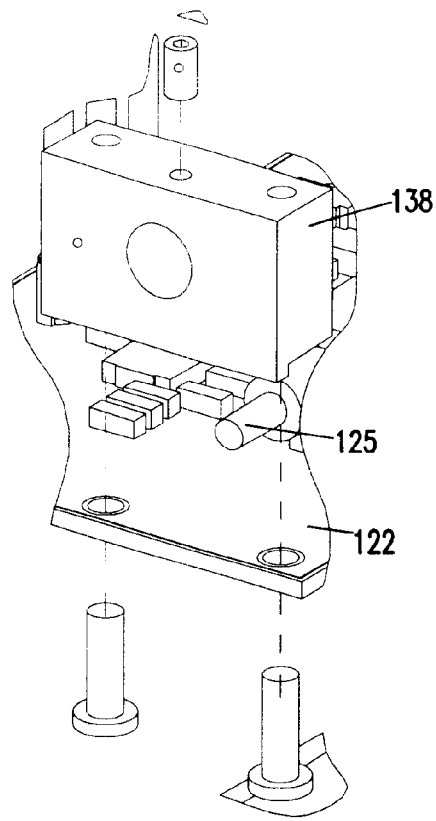
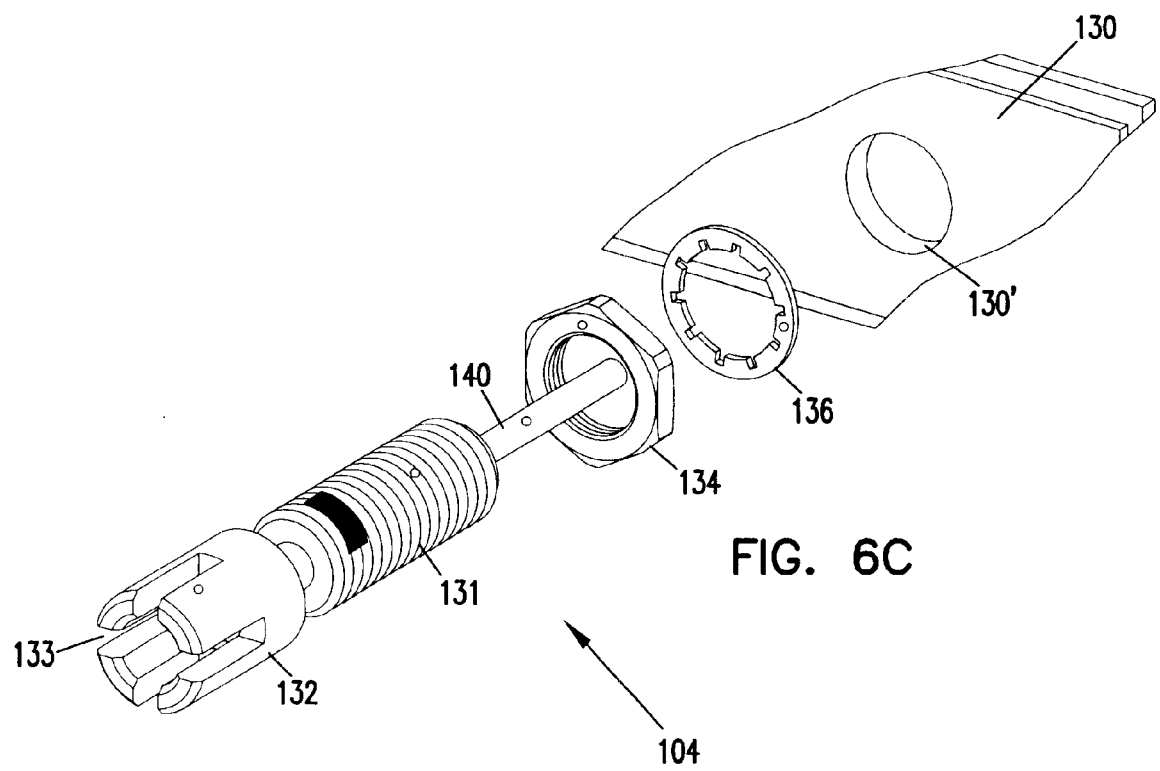
FIG. 6C

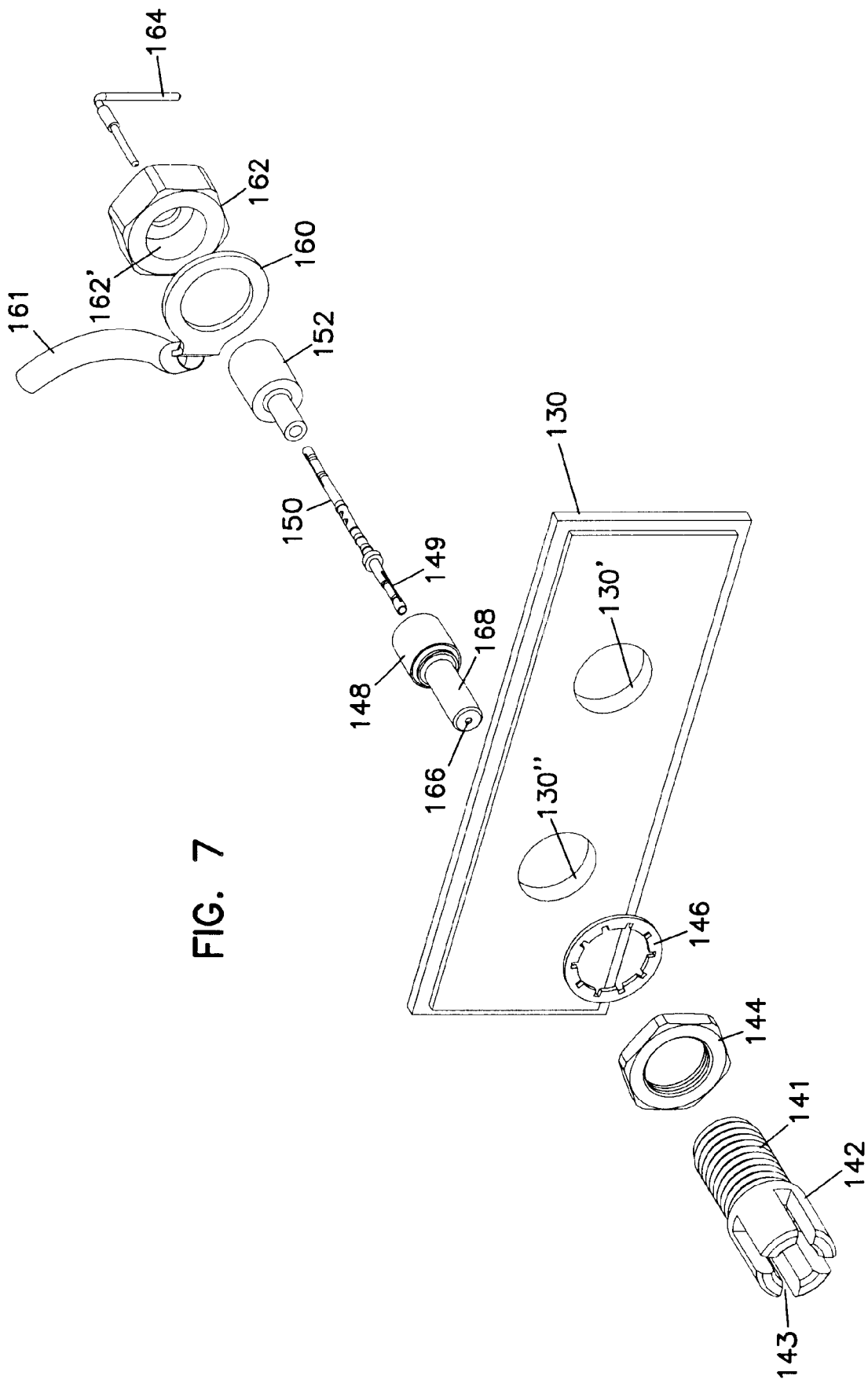

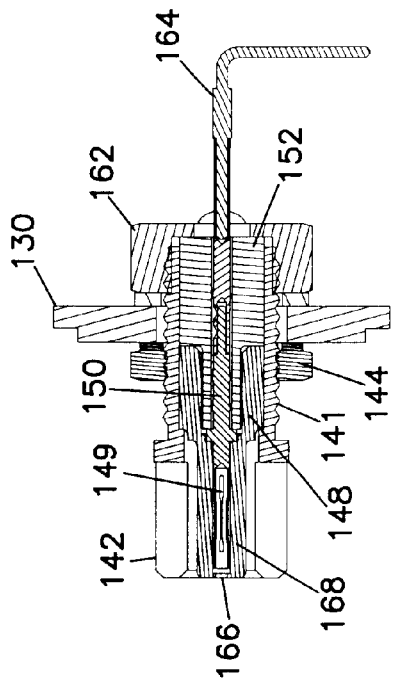
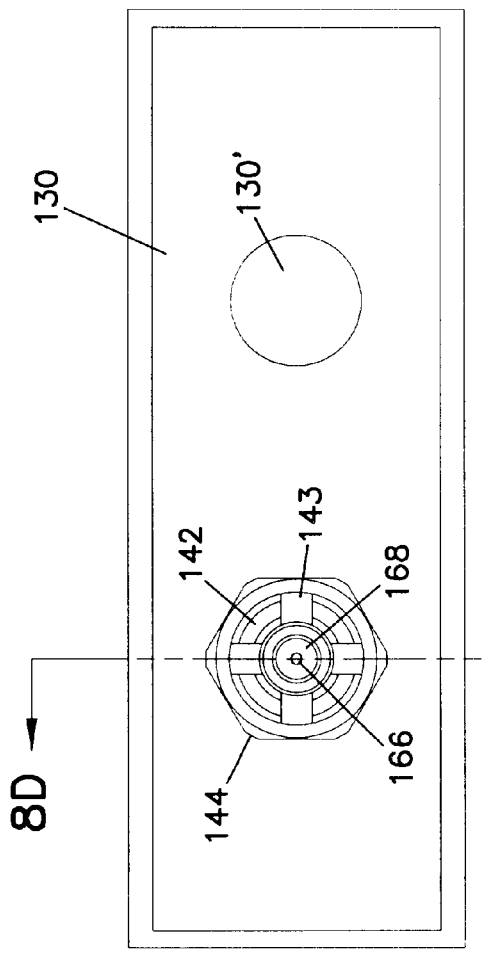
FIG. 8D
FIG. 8A

FIG. 9A
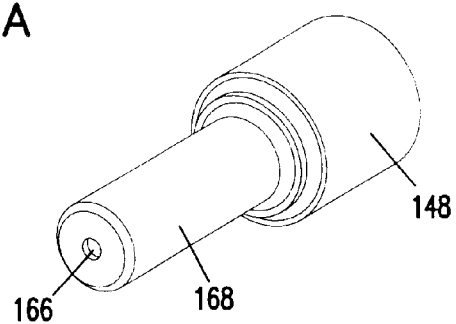
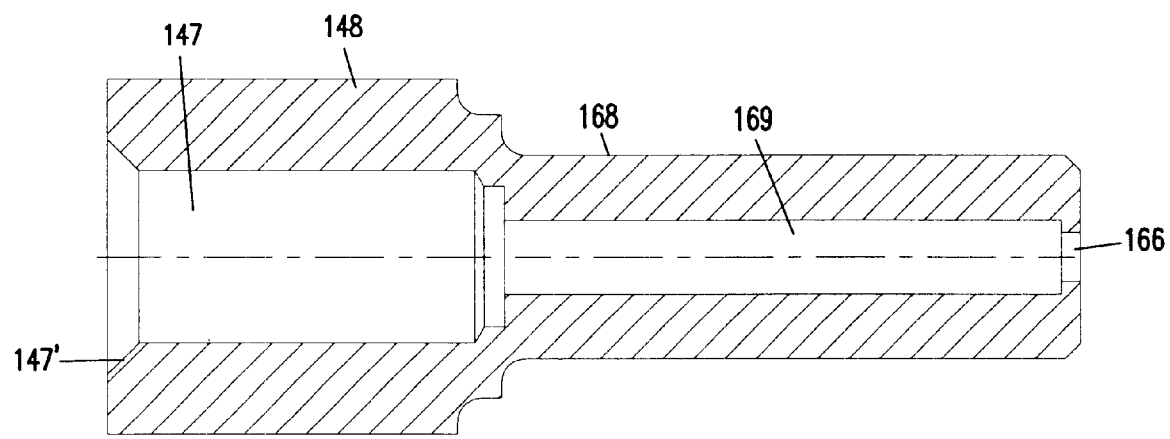
FIG. 9B

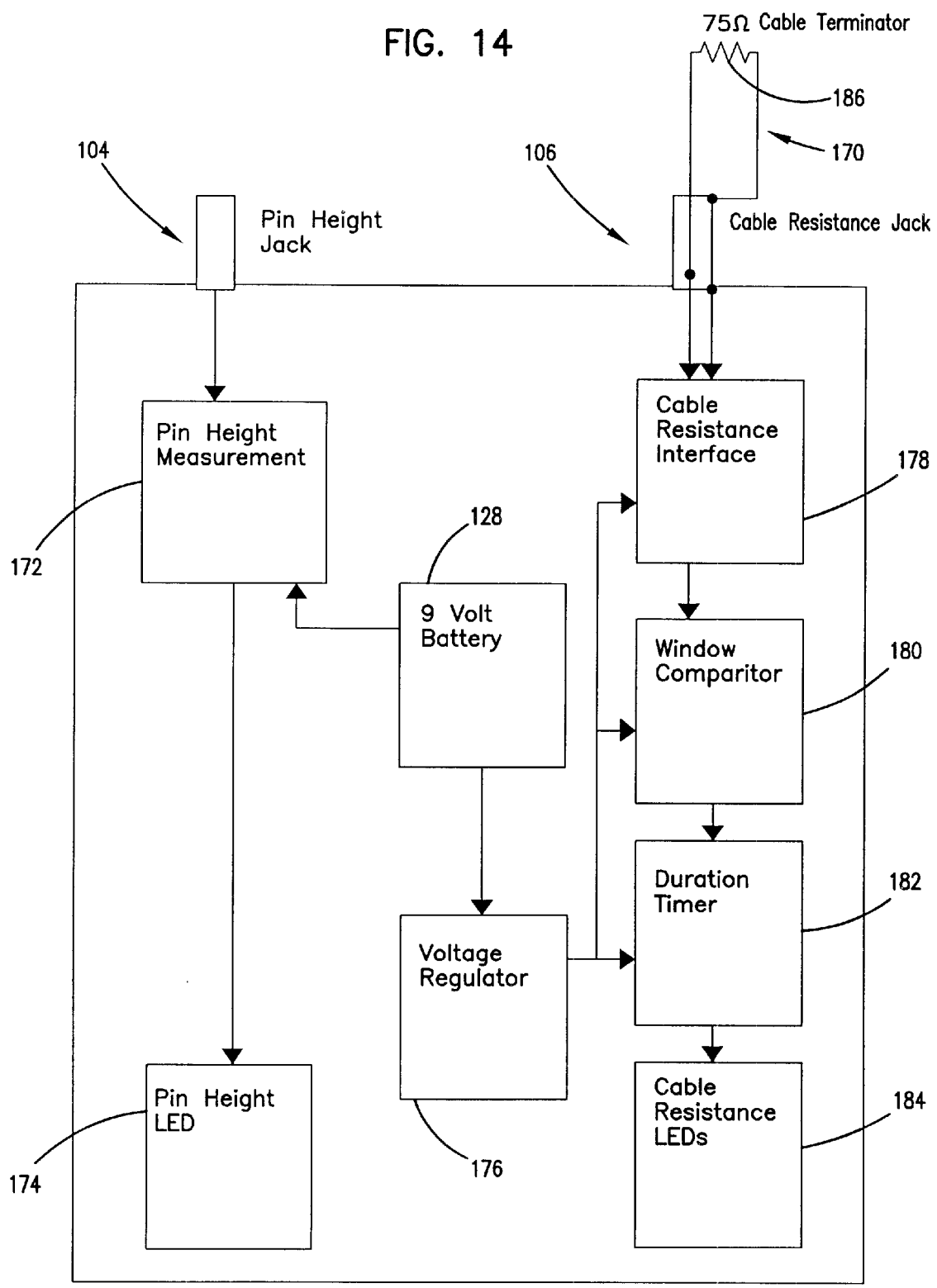

DEVICE FOR TESTING COAXIAL CONNECTORS

TECHNICAL FIELD

The present invention is directed to coaxial connector and cable testing, and more specifically to a device for testing continuity, concentricity, and/or pin height of coaxial connectors and cables.

BACKGROUND

Cables with coaxial connectors are prevalently used for electrical signal transfer. Various types of coaxial connectors are available, such as BNC connectors and miniature coaxial connectors. The coaxial connector has a sleeve portion that is typically connected to the signal ground conductor of the cable, and the connector has a center pin that is the termination of the cable's signal conductor. The center pin is positioned concentrically within the sleeve and conducts the signal from the source to the destination.

The coaxial cable's ability to carry the signal from the source to the destination is dependent upon the cable's qualities and those of the coaxial connectors at each end. The cable must have sufficient signal continuity through the electrical signal conductor to its ends and through the signal ground conductor to the sleeves. Thus, short circuits or open circuits within the cable and connector are prohibited. Additionally, continuity between a connector and jack must be established by the coaxial connector's interface to the jack. This interface requires that the coaxial connector have center pin concentricity such that the center pin properly enters a connector jack receptacle that conducts the signal received from the center pin when the sleeve engages a receiving sleeve of the jack. Furthermore, the center pin must extend far enough (i.e., have a sufficient pin height) relative to the sleeve position to engage the receptacle of the connector to establish signal continuity between the connector and the jack.

When installing coaxial cables, it is difficult to verify that the cable and connector meet requirements such as those mentioned above. Care must be exercised in verifying continuity, concentricity, and pin height to avoid further damage to the connector. This is especially true for miniature coaxial connectors where the center pin is more vulnerable.

Thus, there is a need for a device that permits continuity, concentricity, and pin height to be easily tested for a coaxial connector and cable without risking damage to the connector.

SUMMARY

The present invention provides a device that may easily test one or more of the qualities of a coaxial cable and connector without harming the coaxial connector. Embodiments of the present invention provide features that test continuity, pin height, and/or concentricity while providing support for the coaxial connector to prevent damage to the center pin.

The present invention may be viewed as a device for testing a cable having a coaxial connector with a sleeve and a center pin. The device includes a housing having opposing surfaces forming a housing interior with the housing having at least a first and second aperture. A first coaxial connector jack is disposed on one of the surfaces and passes through the first aperture. The first coaxial connector jack has a first center pin receptacle surrounded by a first support shaft that is sized to concentrically receive an inner side of the sleeve of the coaxial connector. The first coaxial connector jack also has a reference electrode.

A second coaxial connector jack is disposed on one of the surfaces and passes through the second aperture. The second coaxial connector jack has a second center pin receptacle surrounded by a second support shaft that is sized to concentrically receive the inner side of the sleeve. First circuitry is disposed within the housing and electrically connected to the first center pin receptacle and the reference electrode. The first circuitry provides electrical power to the coaxial connector received by the first coaxial connector jack to determine whether the electrical resistance of the coaxial connector is within a predetermined range and to provide a first external indication of the determination.

A first switch is in operable connection with the second center pin receptacle, and the switch is repositioned in response to the second center pin receptacle receiving the center pin of the coaxial connector that has a length greater than a threshold. Second circuitry is disposed within the housing and is electrically connected to the first switch, with the second circuitry providing a second external indication in response to the first switch being repositioned.

The present invention may be viewed as another device for testing a cable having a coaxial connector with a sleeve and center pin. The device includes a housing having opposing surfaces forming a housing interior, and the housing has at least a first aperture. A first coaxial connector jack is disposed on one of the surfaces and passes through the first aperture and has a first center pin receptacle surrounded by a first support shaft that is sized to concentrically receive an inner side of the sleeve of the coaxial connector. The first coaxial connector has a reference electrode, and first circuitry is disposed within the housing and electrically connected to the first center pin receptacle and the reference electrode. The first circuitry provides electrical power to the coaxial connector received by the first coaxial connector jack to determine whether the electrical resistance of the coaxial connector is within a predetermined range and to provide an external indication of the determination.

The present invention may be viewed as another device for testing a cable having a coaxial connector with a sleeve and a center pin. The device includes a housing having opposing surfaces forming a housing interior, and the housing has at least a first aperture. A first coaxial connector jack is disposed on one of the surfaces and passes through the first aperture, and the first coaxial connector jack has a first center pin receptacle surrounded by a first support shaft that is sized to concentrically receive an inner side of the sleeve of the coaxial connector. A first switch in operable connection with the first center pin receptacle is repositioned in response to the first center pin receptacle receiving a center pin of the coaxial connector that has a length greater than a threshold. First circuitry is disposed within the housing and electrically connected to the first switch and provides an external indication in response to the first switch being repositioned.

The present invention may be viewed as another device for testing a cable having a coaxial connector with a sleeve and a center pin. The device includes a coaxial connector jack that includes a first support shaft having a first pin entryway of a first diameter at a receiving end of the support shaft with the support shaft being sized to receive an inner side of the sleeve. The connector jack also includes a first center pin receptacle that is surrounded by the first support shaft and has an inner diameter at a receiving end of the receptacle greater than or equal to the first diameter.

The present invention may be viewed as another device for testing a cable having a coaxial connector with a sleeve and a center pin. The device includes a coaxial connector jack having a first support shaft being sized to receive an inner side of the sleeve. The connector jack also includes a first center pin receptacle surrounded by the first support shaft and a concentric outer support surface surrounding the first support shaft. The outer support surface is sized to concentrically engage an outer side of the sleeve, and the outer support surface has longitudinal slots that accept barbs extending radially from the coaxial connector that limit rotation of the coaxial connector while allowing longitudinal movement of the coaxial connector.

DESCRIPTION OF THE DRAWINGS

FIG. 1 is a perspective view of one style of coaxial connector for use with an embodiment of the present invention.

FIG. 2 is a side elevation view of the miniature coaxial connector of FIG. 1.

FIG. 6A is an exploded perspective view of the embodiment of the present invention.

FIG. 6B is a partial exploded perspective view of a pin height structure of the embodiment of the present invention.

FIG. 6C is a partial exploded view of a connector jack of the embodiment of the present invention for testing pin height and/or concentricity.

FIG. 7 is an exploded view of a structure of an embodiment of the present invention for testing continuity and/or concentricity.

FIGS. 8A–8D are top, top front perspective, top rear perspective, and cross-sectional views, respectively, of the assembled connector jack structure of FIG. 7.

FIGS. 9A and 9B are perspective and cross-sectional views, respectively, of a support shaft of the connector jack of FIG. 7.

FIG. 14 is a block diagram of the electrical circuitry involved in testing pin height and continuity.

DETAILED DESCRIPTION

Figure 3:
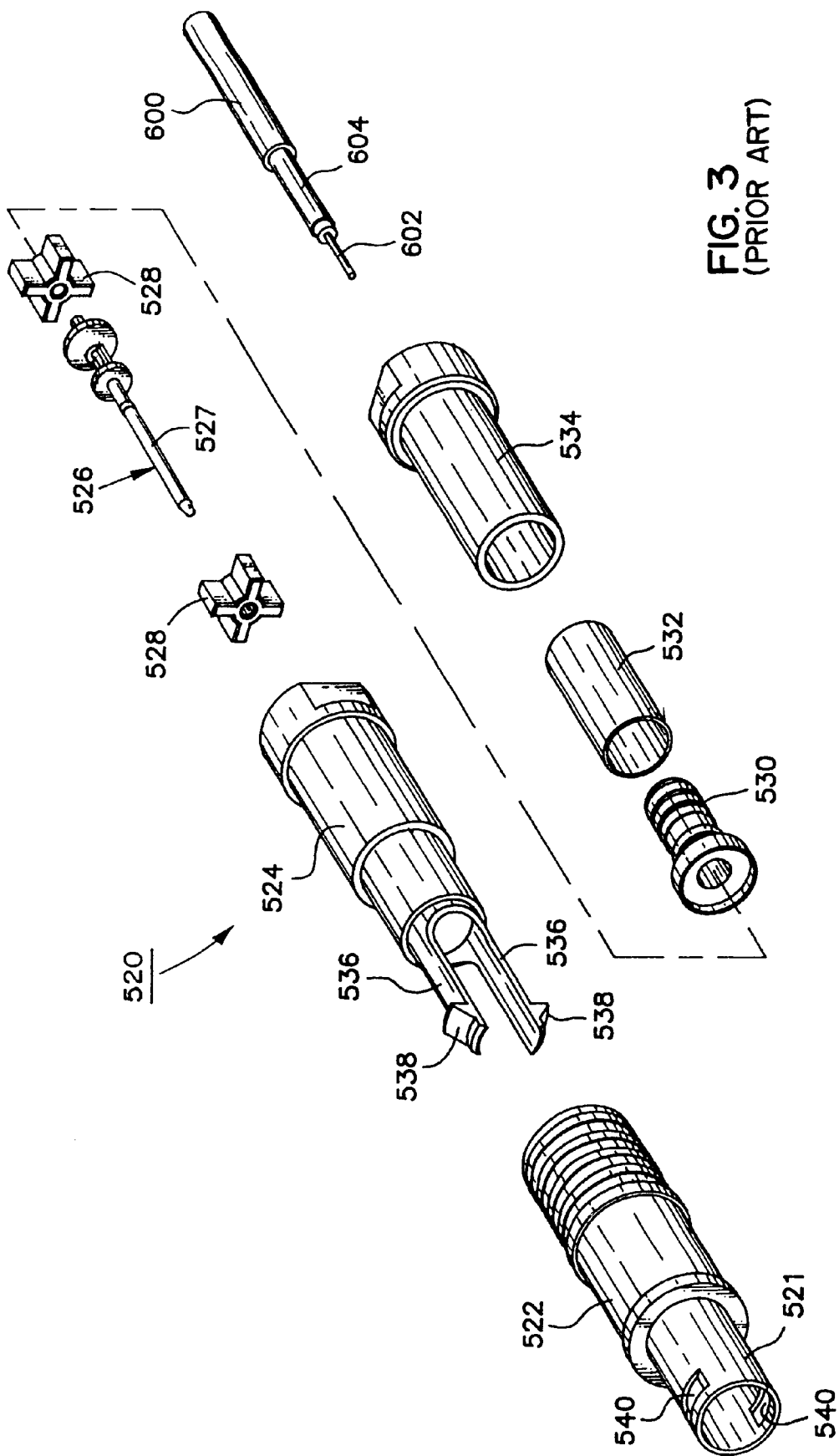
FIG. 3 is an exploded perspective view of the coaxial connector of FIG. 1.

Various embodiments of the present invention will be described in detail with reference to the drawings, wherein like reference numerals represent like parts and assemblies through the several views. Reference to various embodiments does not limit the scope of the invention, which is limited only by the scope of the claims attached hereto.

FIGS. 1–4 illustrate an exemplary coaxial connector 520 for electrically connecting a coax cable (not shown) to a coax jack and its ordinary connection to a typical connector jack. The connector 520 includes a generally cylindrical outer jacket 522. A barbed insert 524 is provided and is sized to be received within the interior of jacket 522. The elements of the connector 520 further include a conductor pin 526, dielectric spacers 528, first and second cooperating crimping members 530, 532, and a rear retaining sleeve 534. A coax cable with a central conductor and ground sleeve is connected to the connector 520.

Figure 4:
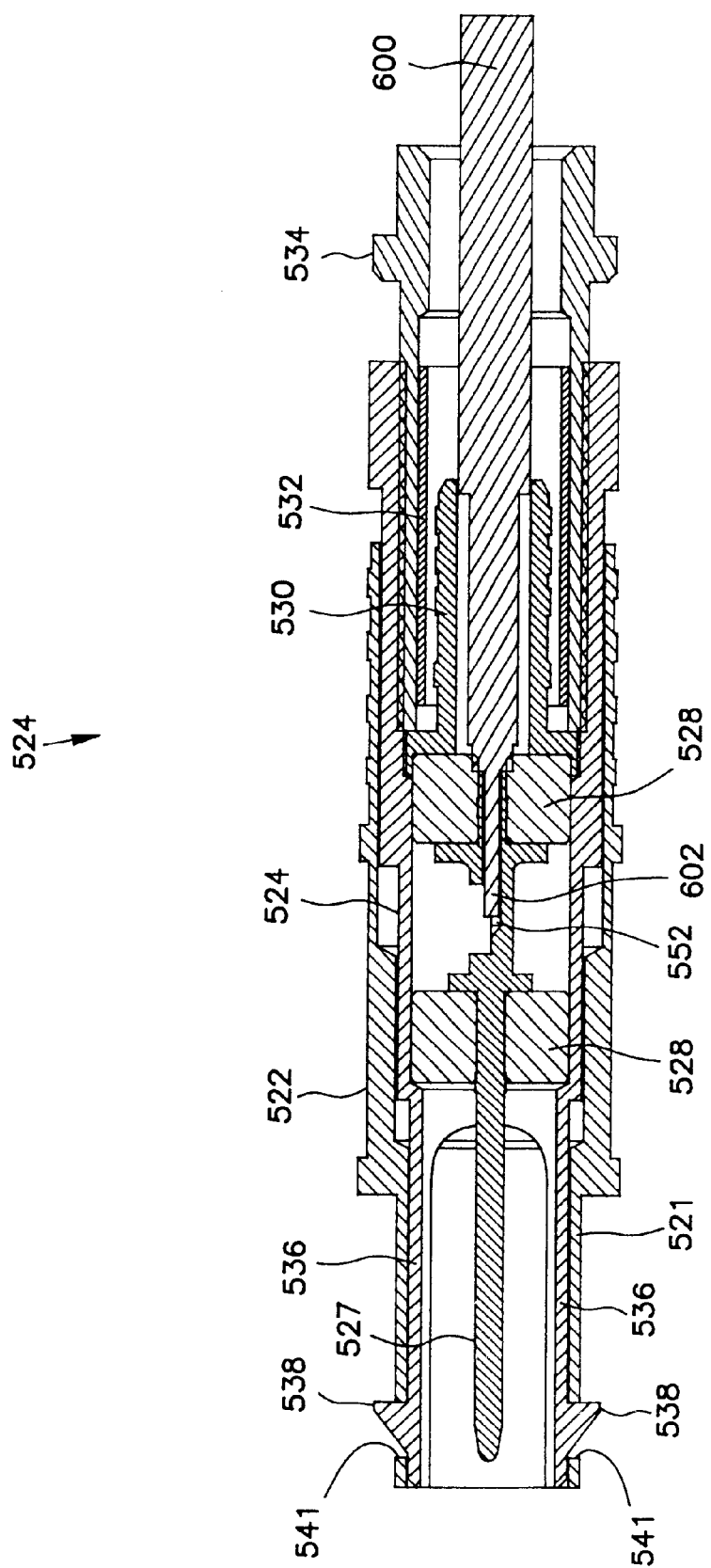
FIG. 4 is an assembled cross-sectional view of the coaxial connector of FIG. 1.
Figure 5B:
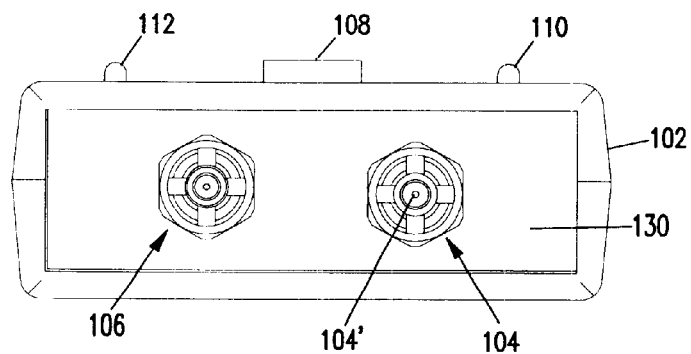
FIGS. 5A–5D are top, front, right side, and perspective views, respectively, of an embodiment of the present invention for use with the coaxial connector of FIG. 1.
Figure 5A:
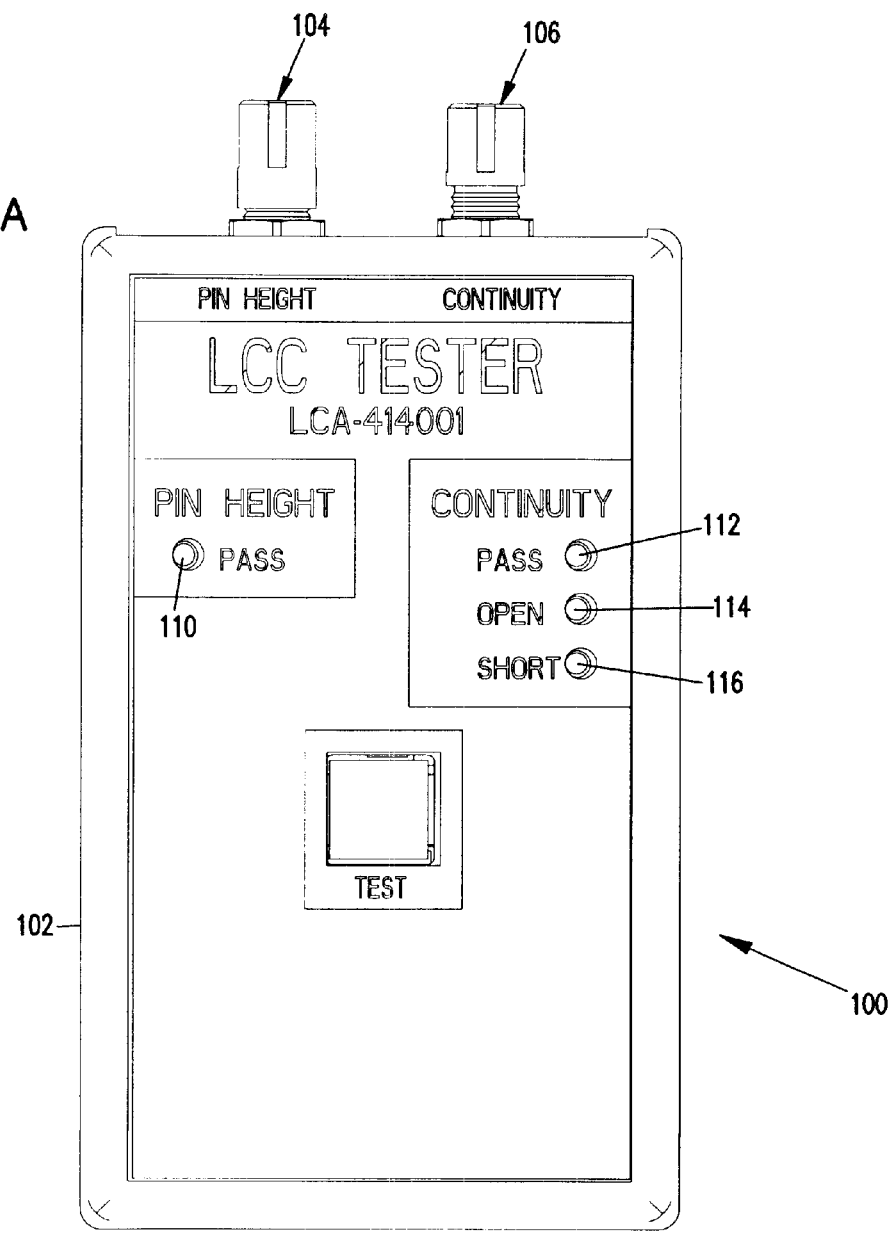
Figure 5C:
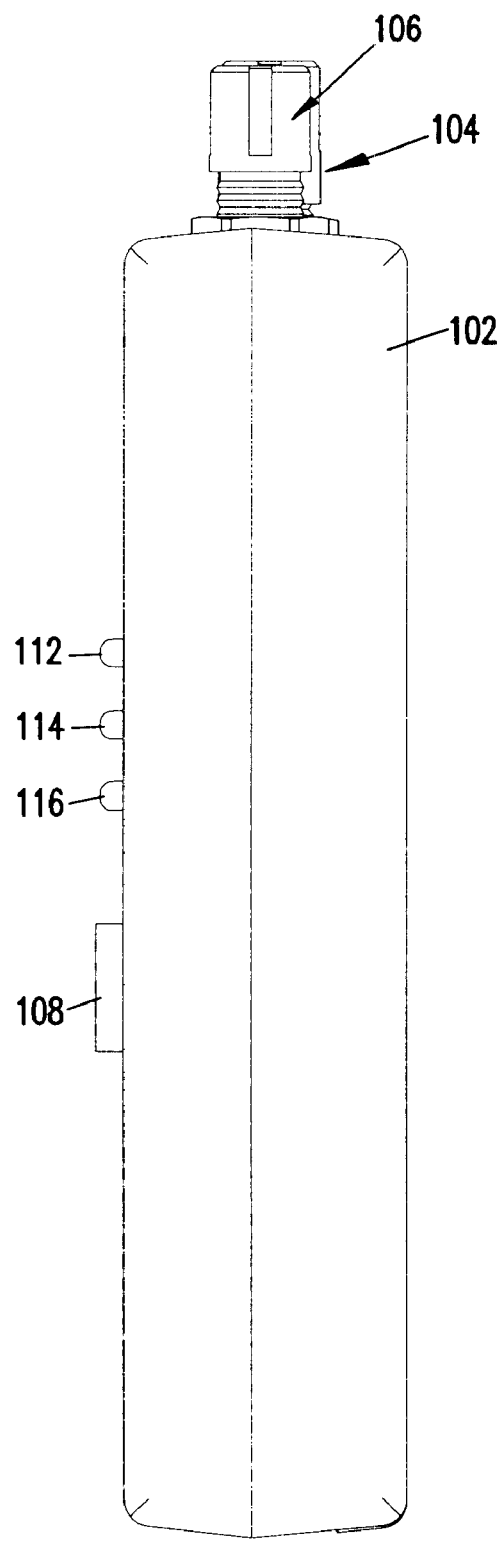
Figure 5D:
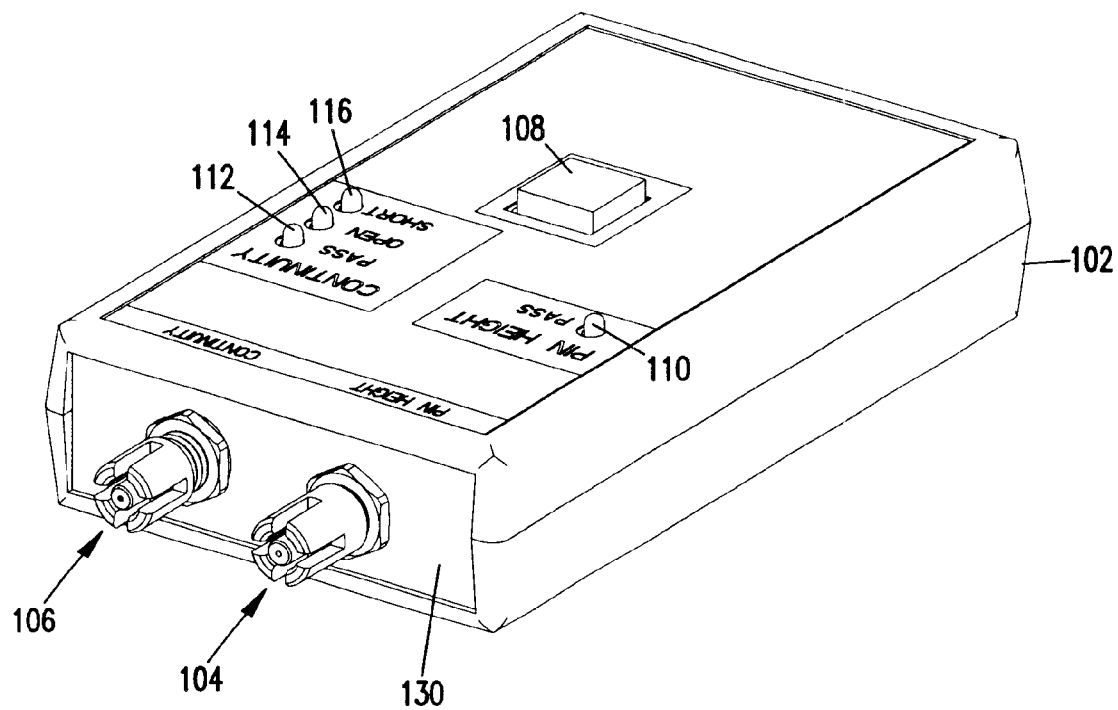

Shown best in FIGS. 3 and 4, barbed insert 524 is slidably received within outer jacket 522. The barbed insert has diametrically opposed arcuate and projecting barbs 536. Projecting outwardly from barbs 536 are protruding and angularly ramped locking tabs 538. Tabs 538 project through slots 540 formed in a reduced diameter portion 521 of outer jacket 522. Reduced diameter portion 521 is sized to be received within rear ports formed in a housing body (not shown).

The locking tabs 538 are disposed so that they are received within grooves of the housing to retain connector 520 from axial movement relative to the housing while permitting rotational movement. With the connector 520 so received, the center pin 527 of conductor 526 is disposed so that they are received within pin receiving conductors. The insulators 528 retain the pin 526 in concentric spaced relative to the conductive insert 524 and conductive outer jacket 522. The pin includes a conductor-receiving bore 552 sized to receive a central conductor of a commercially available coax cable.

The grounded shield of the coaxial cable is placed between the opposing surfaces of crimping members 530, 532 after which outer crimping member 532 may be crimped against inner crimping member 530 to securely connect the grounding shield of the coaxial cable to the conductive outer jacket 520 in insert 524. The rear retaining sleeve 534 may be connected to the insulated sheeting of the coaxial cable with the rear retaining sleeve 534 connected to insert 524 by cooperating threads on the exterior of rear connecting sleeve 534 and the interior of insert 524.

The connector 520 is inserted into bores by simply axially thrusting the connector 520 into the bores with the center pin 527 being electrically and mechanically received by pin conductors. Flexibility of the barbs 536 permits tabs 538 to flex inwardly to permit insertion. The tabs 538 then flex outwardly to be captured within annular grooves of the jack. To retract the connector 520, an operator simply pulls on outer jacket 522. A slot defining edge 541 on reduced diameter portion 521 urges against the ramp of tabs 538 to force the tabs 538 inwardly out of their locking position in grooves 517. This permits removal of the connector 520.

FIGS. 5A–5D show various external views of an embodiment of the present invention for testing the coaxial connector of FIG. 1 and the coaxial cable extending from the connector. It is to be understood that embodiments of the present invention may be used with other styles of coaxial connectors in addition to the coaxial connector of FIG. 1, including BNC connectors. The testing device 100 includes an exterior housing 102. The housing has a top face 130 that has two connector jacks 104 and 106 mounted to it. As shown one jack 104 is used to test pin height and concentricity. The other jack 106 is used to test electrical continuity and may be used to test concentricity to a finer precision.

Circuitry discussed below is included within the housing 102 and is associated with the first jack 104 and the second jack 106 to enable the various testing. A button 108 protrudes from the housing 102 and may be depressed by a user to activate the circuitry used to test continuity through the jack 106. A pin height light 110, such as a light emitting diode (LED), protrudes from the housing 102 to provide an external indication to the user when the pin height is sufficient in response to the user placing the connector on the jack 104. A continuity pass light 112 provides an external indication to the user when the cable and connector continuity through jack 106 is satisfactory. Short circuit light 116 and open circuit light 114 provide an external indication to the user when the connector and/or cable provide a short circuit or open circuit, respectively.

FIGS. 6A–6C are various exploded views of the testing device 100. The housing 102 includes a front piece 120 and a back piece 118 that are fastened together. A label 120' may be placed on the front piece 120 to provide names for the lights so the user may correctly interpret each external indication. A battery 128, such as a conventional 9V alkaline, may be stored within the housing 102 to provide power to the circuitry. The top piece 120 has a pin height light aperture 110', a pass light aperture 112', an open light aperture 114', and a short light aperture 116' that allow the associated LEDs to protrude. A button aperture 108' is included in the top piece 120 to allow the button 108 to protrude.

The circuitry is provided on a printed circuit board 122. A pin height switch 126 is included to facilitate testing of the pin height of the connector. The pin height switch includes a switch arm 125 that moves to close the switch 126 when the pin height is of sufficient length. A pin height shaft 140 that is included in the pin height connector 104 contacts the switch arm 125. The center pin 527 of the connector 520 contacts the pin height shaft 140 and causes it to move which then moves the switch arm 125. The movement of the switch arm 125 completes the circuit that causes the pin height LED 110 to light.

The pin height jack 104 includes an outer support surface 132 that threadedly engages a mounting shaft 131, and the outer support surface 132 has slots 133 sized to received the barbs 538 to establish a slip-fit by allowing longitudinal movement of the connector 520 while limiting its rotation. The mounting shaft includes a support shaft that extends concentrically through the hole in the outer support surface 132, which is more clearly shown in FIG. 13. The support shaft has a concentric hole 104' that acts as a center pin receptacle. The center pin 527 passes through the center pin receptacle 104' and is supported by the support shaft as the center pin 527 contacts the pin height shaft 140. The support shaft is sized to receive the inner portion of the sleeve 521 while receiving the center pin 527 through the center pin receptacle 104'. The outer support surface 132 is sized to receive the outer portion of sleeve 521.

The mounting shaft 131 passes through an aperture 130' in the top face 130 of the housing 102. A nut 134 and lock washer 136 may be used to hold the jack 104 in place along with block 138. Block 138 threadedly engages the mounting shaft 131 and also fastens to the front piece 120 and rear piece 118 of the housing 102. The block 138 has a threaded aperture 137, shown in FIG. 12, that allows the connector jack 104 to pass into the interior of the housing 102 and interact with the switch 136. A continuity switch 124 is also included on the printed circuit board 122 and is operably connected to the button 108. The continuity switch 124 completes a circuit when the button 108 is depressed, and the circuit then lights an indicator accordingly.

FIG. 7 shows the continuity jack 106 in greater detail. The continuity jack includes a threaded mounting shaft 141 and an outer support surface 142. The outer support surface 142 is sized to receive the outer portion of the sleeve 521 of the connector 520. The outer support surface includes slots 143 sized to receive the barbs to establish a slip-fit by allowing longitudinal movement of the connector 520 while limiting its rotation. A nut 144 and lock washer 146 may be threaded on the mounting shaft 141 to hold it in place within an aperture 130" in the top piece 130. A nut 162 with a cavity 162' may be used to thread onto the mounting shaft 141 from the interior to lock the connector 106 in place. The cavity 162' allows various components of the jack 106 to concentrically fit within the nut 162.

A fitting 148 including a support shaft 168 fits concentrically within the mounting shaft 141. The support shaft 168 has a hole 166 that acts as a center pin entryway for the center pin 527 of the connector 520. A center pin receptacle 149 fits within the fitting 148 and receives the center pin 527 after it has passed through the center pin entryway 166. A second fitting 152 engages the fitting 148 and has an internal shaft that surrounds the conductor 150 of the center pin receptacle 149.

A ground ring 160 fits over the mounting shaft 141 and is held in place along with the fittings by the nut 162. The ground ring 160 through the nut 162 and mounting shaft 141 is in electrical connection with the sleeve 521 of the connector 520 when installed on the jack 106. A bend-conductor 164 passes through the cavity 162' of the nut 162 and is electrically connected to the conductor 150. The bend-conductor 164 is in electrical communication with the continuity circuitry on the printed circuit board 122. The ground ring 160 is connected to circuit ground through ground conductor 161.

Thus, the continuity circuitry attempts to pass electrical current through the bend-conductor 164, the conductor 150, and the center pin receptacle 149 and into the center pin 527. The cable having connector 520 attached to jack 106 has a terminator on its other end and current flows through center pin 527 and the terminator and then back through the ground conductor to the sleeve 520. Current then travels through the mounting shaft 141 to the ground ring 160 and to circuit ground.

Figure 8B:
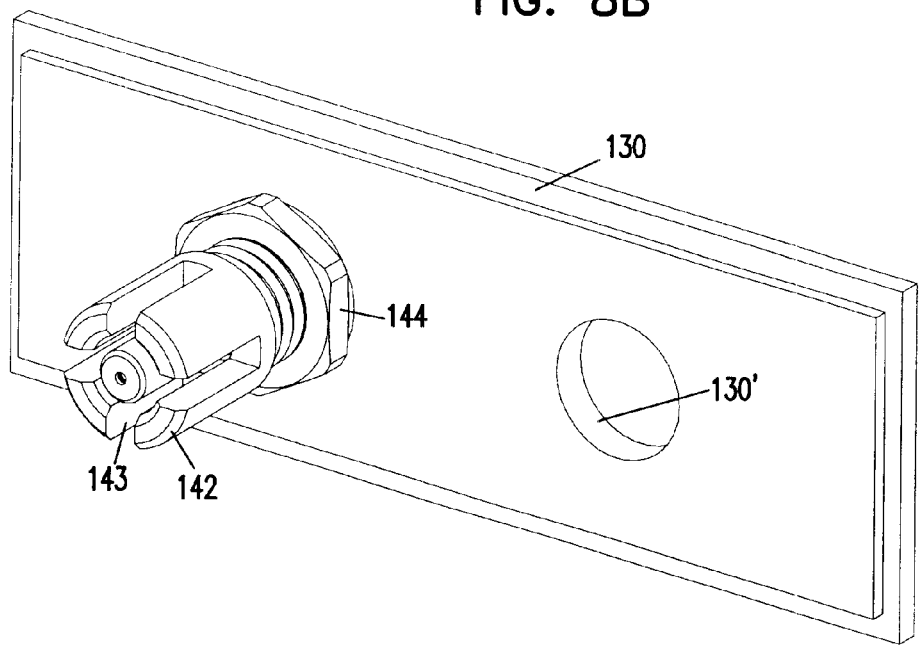
Figure 8C:
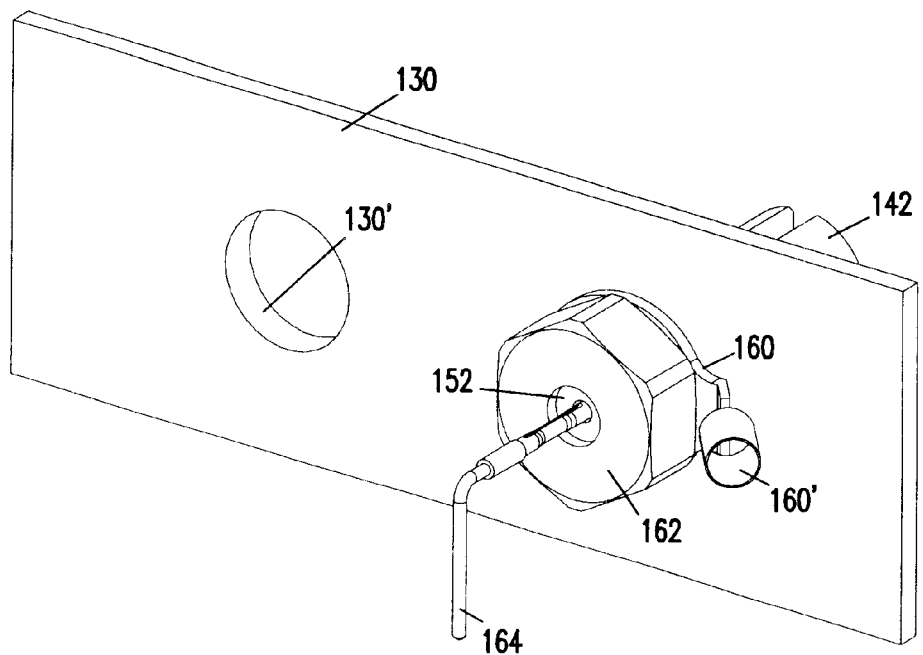

FIGS. 8A–8C show various views of the assembled continuity jack 106. The relative assembled position of the mounting shaft 141, nut 144, top piece 130, ground ring 160, nut 162, support shaft 168, fitting 152, and bend-conductor 164 can be seen. The ground conductor terminal 160' of the ground ring 160 for attachment to the ground conductor 161 can also be seen. FIG. 8D shows a cross-section taken through line 8D—8D of FIG. 8A.

As can be seen in FIG. 8D, the center pin entryway 166 has a diameter that is not greater than the inner diameter of the center pin receptacle 149. Because the center pin 527 must pass through the entryway 166 prior to engaging the receptacle 149, the pin 527 must have proper concentricity to pass through the hole once the sleeve 521 has engaged the outer part of support shaft 168, and the outer surface of the receptacle 149 becomes inaccessible to the center pin 527. Therefore, the center pin 527 cannot pass between the outer surface of receptacle 149 and the interior shaft of the support shaft 168, and damage to the center pin 527 is avoided because the center pin 527 correctly enters the inner shaft of the receptacle 149.

FIGS. 9A and 9B show the fitting 148 having the support shaft 168 and entryway 166. The fitting 148 must act as an electrical insulator to prevent a short circuit between the center pin receptacle 149 and the mounting shaft 141. DELRIN insulator is an example of a suitable material for the fittings. The fitting 148 has a pin entryway 166 having a diameter that is less than the inner shaft 169 of the fitting 148. The inner shaft 169 houses the center pin receptacle 149. As mentioned, the smaller diameter of entryway 166 prevents the center pin 527 from becoming misaligned before entering the receptacle 149. Furthermore, the smaller diameter may ensure that the center pin 527 has a high degree of concentricity relative to the sleeve 521.

The fitting 148 has a larger diameter shaft 147 at the end away from support shaft 168. The larger diameter shaft 147 is sized to receive a small diameter end 151 of the second fitting 152 shown in FIGS. 11A and 11B. The larger diameter shaft 147 may have a flared end 147' to facilitate assembly with the second shaft 152.

Figure 10A:
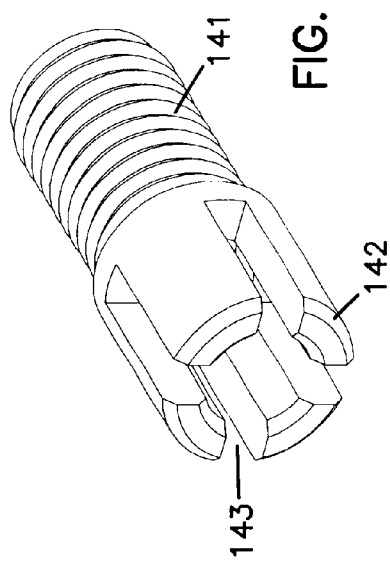
FIGS. 10A–10C are perspective, cross-sectional, and front views, respectively, of an outer support surface of the connector jack of FIG. 7.
Figure 10C:
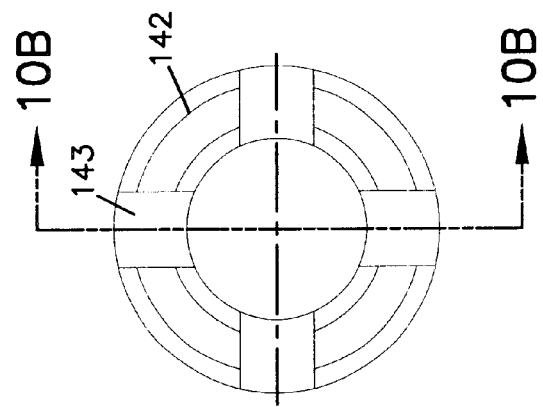
Figure 10B:
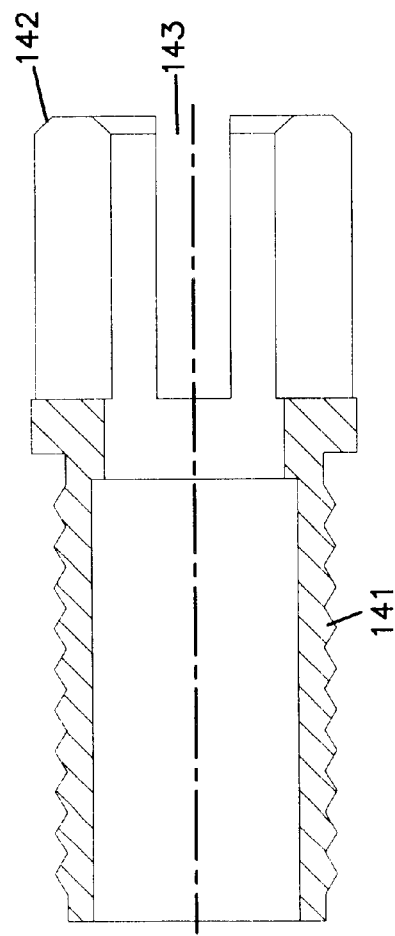
Figure 11A:
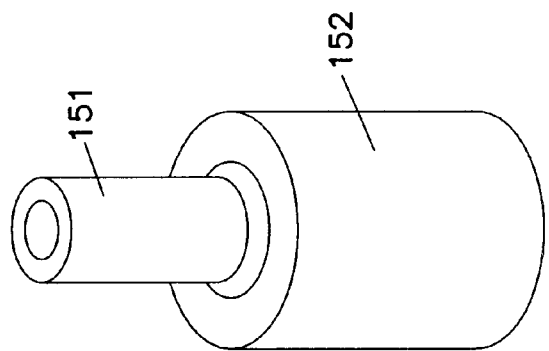
FIGS. 11A and B are perspective and cross-sectional views, respectively, of a center pin receptacle support of the connector jack of FIG. 7.
Figure 11B:
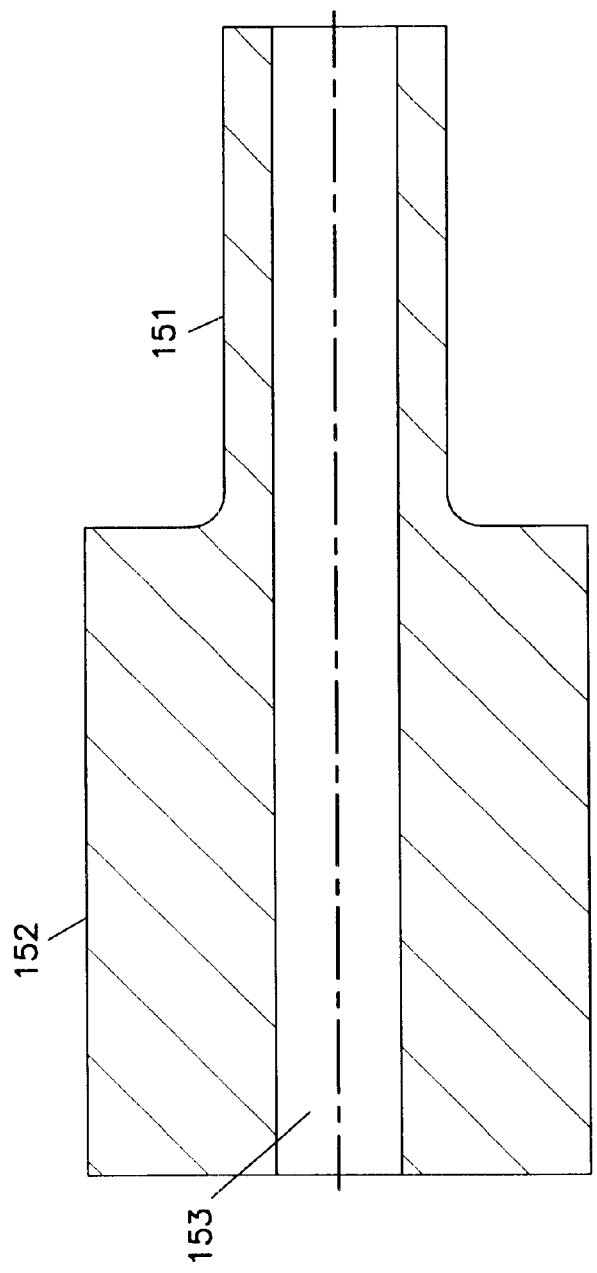
Figure 12C:
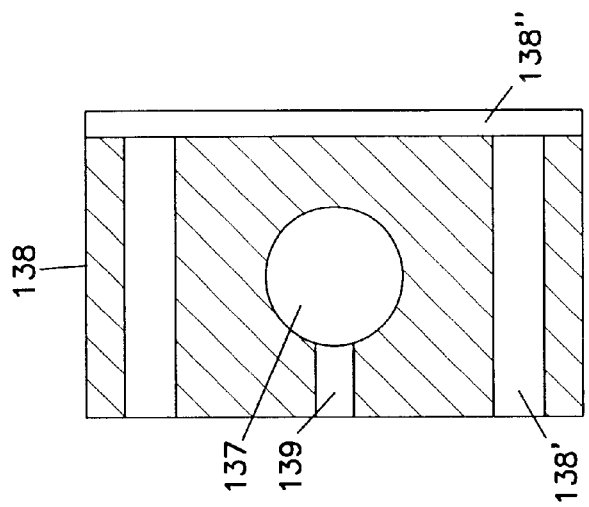
FIGS. 12A–12D are front, top, cross-sectional, and right side views, respectively, of a block fitting of the connector jack of FIG. 6B.
Figure 12B:
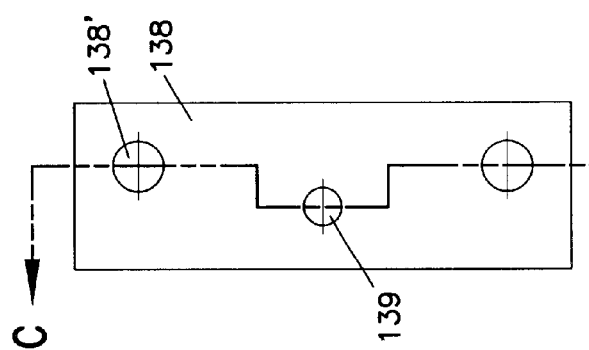
Figure 12D:
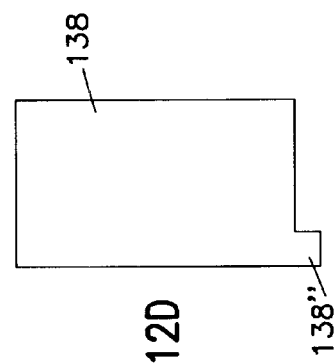
Figure 12A:
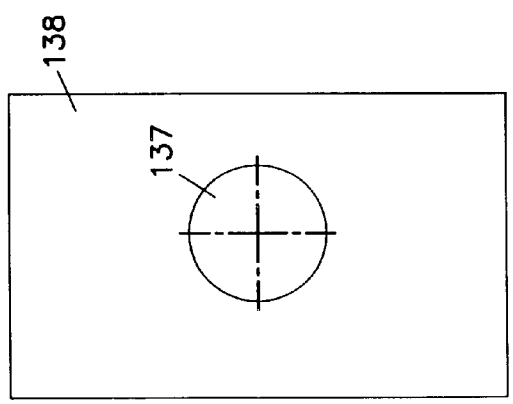

FIGS. 10A and 10B show the mounting shaft 141 of the continuity jack 106. The outer surface 142 and slots 143 of the mounting shaft 141 are also visible. The cross-section of the mounting shaft 141 taken through line 10B—10B of FIG. 10C can be seen in FIG. 10B. As mentioned, FIGS. 11A and 11B show the second fitting 152 and its smaller diameter end 151. The second fitting 152 has an inner shaft 153 that houses the conductor 150 of the center pin receptacle 149.

FIGS. 12A–12D show the block 138 used with the pin height jack 104. The block 138 has a threaded aperture 137 for engaging the mounting shaft 131. The block 138 has mounting apertures 138' and 139 for receiving fasteners that hold the block 138 in place relative to the printed circuit board 122 and the housing 102. A lip 138" is included on the rear side of the block 138 which overhangs a top edge of the printed circuit board 122 to facilitate the proper positioning and the stabilization of the block 138 relative to the printed circuit board 122.

Figure 13:
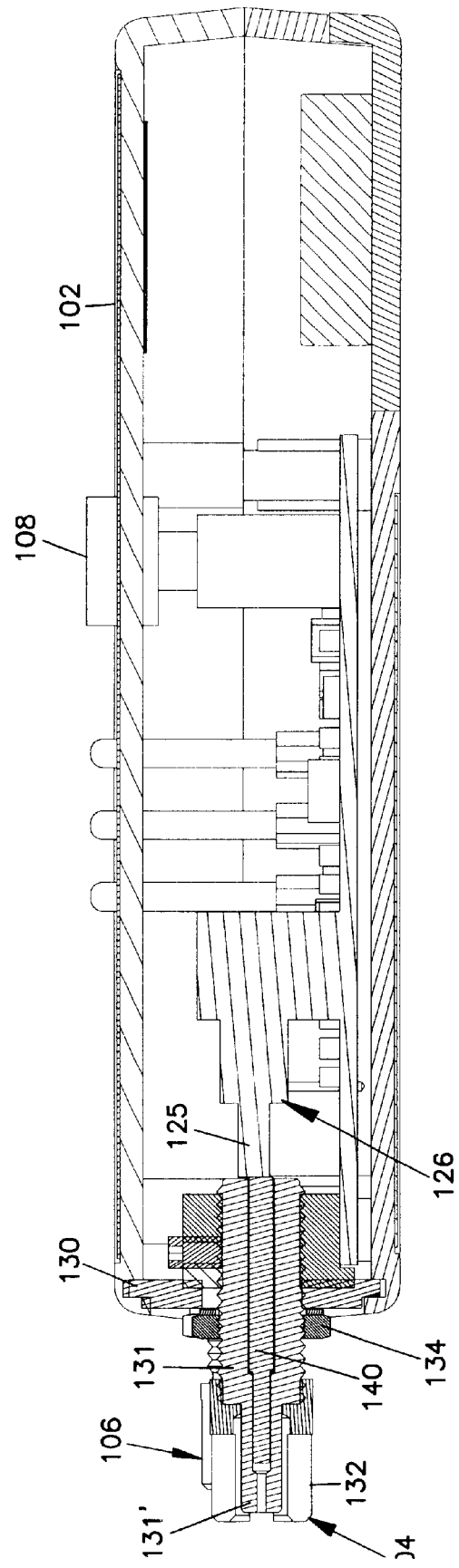
FIG. 13 is a cross-sectional view of the embodiment of the present invention shown in FIG. 5A taken through the connector jack structure for testing pin height and/or concentricity.

FIG. 13 shows a cross section of the testing device 100 taken through the pin height jack 104. As can be seen, the pin height jack 104 includes the outer surface 132, the mounting shaft 131 with support shaft 131' having a receptacle 104' extending through the mounting shaft 131 until contacting the pin height shaft 140. The mounting shaft 131 has an inner shaft of greater diameter than the center pin 527 for housing the pin height shaft 140 that also has a greater diameter than center pin 527. The pin height shaft 140 passes through the aperture 130' in the top piece 130 and then through the aperture 137 of the block 138 and contacts the switch arm 125 of pin height switch 126.

The support shaft 131' of the pin height jack 104 may be made of metal because conduction of electricity through the cable is not utilized for this test and an electrical short between the sleeve 521 and the center pin 527 is not a concern. The metal support shaft 131' enhances the durability of the jack 104 when testing connectors 520 that are not sufficiently concentric. Thus, it may be desirable to test concentricity first by attempting to insert the connector 520 into the pin height jack 104 and then attempting to insert the connector 520 to the continuity jack 106, which may test concentricity to a finer precision because the entryway 166 may be of a diameter that is less that the diameter of the center pin receptacle 104' of the pin height jack 104.

FIG. 14 shows a block diagram of the circuitry used by the testing device 100. A 9 Volt battery 128 may be included to provide DC power to the pin height circuit and the continuity circuit. The pin height measurement circuit 172 includes the switch 126 that completes a circuit between the battery 128 and the pin height LED 110. When the switch is closed by insertion of a connector 520 with proper center pin length, then the LED 110 lights.

The 9 Volt battery 128 is also connected to a standard linear voltage regulator 176. The voltage regulator 176 receives voltage from the 9 Volt battery 128 when the user depresses the button 108 to close switch 124. The voltage regulator 176 then provides a steady DC output of about 5 Volts to a cable resistance interface 178 that includes the bent-conductor 164 linked to the center pin receptacle 149. This causes current to flow through the attached cable 170 and terminator 186, which is typically 75 ohms for a standard coaxial cable. The voltage regulator 176 provides power to a window comparator 180 consisting of a dual comparator IC that receives the current passed through the cable. The window comparator 180 uses three separate windows with one window detecting a shorted condition, one window detecting a pass condition, and one window detecting an open condition. The output of each comparator feeds directly to the corresponding LED.

The duration timer 182, such as a TL555C timer configured as a monostable multi-vibrator, also receives power from the regulator 175. The duration timer 182 creates an interval that power is provided from the regulator for the LEDs to light. The LEDs may remain lit for the interval, such as 10 seconds, or until the button 108 is released, whichever is sooner.

For a standard coaxial cable and a 75 ohm terminator, a typical window range for determining a short circuit is 0 to 25 ohms detected resistance. A typical window range for determining a passing cable is 45 to 135 ohms detected resistance. A typical window range for determining an open circuit is greater than 175 ohms detected resistance.

Although the testing device 100 is shown with both a continuity and a pin height testing circuit, it should be understood that other embodiments may eliminate one or both of these circuits. Furthermore, it should be understood that one jack may be configured to perform all tests, rather than using two separate jacks.

While the invention has been particularly shown and described with reference to preferred embodiments thereof, it will be understood by those skilled in the art that various other changes in the form and details may be made therein without departing from the spirit and scope of the invention.

What is claimed is:

1. A device for testing cables having a coaxial connector having an outermost conductive sleeve and a center pin, comprising:

a housing having opposing surfaces forming a housing interior, the housing having at least a first and second aperture;

a first coaxial connector jack disposed on one of the surfaces and passing through the first aperture, the first coaxial connector jack having a first center pin receptacle surrounded by a first support shaft, the first support shaft concentrically engaged with an inner side of the outermost conductive sleeve of the coaxial connector, the first coaxial connector jack also having a reference electrode;

a second coaxial connector jack disposed on one of the surfaces and passing through the second aperture, the second coaxial connector jack having a second center pin receptacle surrounded by a second support shaft, the second support concentrically engaged with the inner side of the outermost conductive sleeve;

first circuitry disposed within the housing and electrically connected to the first center pin receptacle and the reference electrode, the first circuitry providing electrical power to the coaxial connector received by the first coaxial connector jack to determine whether the electrical resistance of the coaxial connector is within a predetermined range and to provide a first external indication of the determination;

a first switch in operable connection with the second center pin receptacle that is repositioned in response to the second center pin receptacle receiving the center pin of the coaxial connector that has a length greater than a threshold; and second circuitry disposed within the housing and electrically connected to the first switch, the second circuitry providing a second external indication in response to the first switch being repositioned.

2. The device of claim 1, wherein the housing includes a third aperture, the device comprising:

a button extending through the third aperture;

a second switch physically connected to the button and in electrical connection with the first circuitry for controlling the application of power to the first coaxial connector jack.

3. The device of claim 1, wherein the first support shaft is an insulator and the second support shaft is made of metal.

4. The device of claim 1, wherein the first and second coaxial connector jacks have concentric outer support surfaces concentrically engaged with an outer side of the outermost conductive coaxial connector sleeve.

5. The device of claim 4, wherein the concentric outer support surface of the first coaxial connector jack acts as the reference electrode.

6. The device of claim 4, wherein the outer support surfaces of the first and second coaxial connector jacks have longitudinal slots that accept barbs extending radially from the coaxial connector that limit rotation of the coaxial connector while allowing longitudinal movement of the coaxial connector.

7. The device of claim 1, wherein the first support shaft has a first pin entryway at a receiving end with a first diameter and the second support shaft has a second pin entryway at a receiving end with a second diameter different than the first diameter.

8. The device of claim 1 wherein the first and second external indications are lights.

9. A device for testing a cable having a coaxial connector with an outermost conductive sleeve and center pin, comprising:

a housing having opposing surfaces forming a housing interior, the housing having at least a first aperture;

a first coaxial connector jack disposed on one of the surfaces and passing through the first aperture, the first coaxial connector jack having a first center pin receptacle surrounded by a first support shaft, the first support shaft concentrically engaging an inner side of the outermost conductive sleeve of the coaxial connector, the first coaxial connector having a reference electrode, and first circuitry disposed within the housing and electrically connected to the first center pin receptacle and the reference electrode, wherein the first circuitry provides electrical power to the coaxial connector received by the first coaxial connector jack to determine whether the electrical resistance of the coaxial connector is within a predetermined range and to provide an external indication of the determination.

10. The device of claim 9, wherein the first coaxial connector jack has a concentric outer support surface concentrically engaging an outer side of the outermost conductive sleeve.

11. The device of claim 10, wherein the outer support surface of the first coaxial connector jacks has longitudinal slots that accept barbs extending radially from the coaxial connector that limit rotation of the coaxial connector while allowing longitudinal movement of the coaxial connector.

12. The device of claim 9, wherein the first support shaft has a first pin entryway at a receiving end with a first diameter and the first pin receptacle has an inner diameter at a receiving end of the receptacle that is greater than or equal to the first diameter.

13. The device of claim 9, wherein the housing has a second aperture, the device further comprising:

a second coaxial connector jack disposed on one of the surfaces and passing through the second aperture, the second coaxial connector jack having a second center pin receptacle surrounded by a second support shaft, the second support shaft being sized to concentrically receive an inner side of the sleeve, a first switch in operable connection with the second center pin receptacle that is repositioned in response to the second center pin receptacle receiving the center pin of the coaxial connector that has a length greater than a threshold; and second circuitry disposed within the housing and electrically connected to the first switch, the first circuitry providing a visual indication in response to the first switch being repositioned.

14. A device for testing a cable having a coaxial connector with an outermost conductive sleeve and a center pin, comprising:

a housing having opposing surfaces forming a housing interior, the housing having at least a first aperture;

a first coaxial connector jack disposed on one of the surfaces and passing through the first aperture, the first coaxial connector jack having a first center pin receptacle surrounded by a first support shaft, the first support shaft concentrically engaging an inner side of the outermost conductive sleeve of the coaxial connector, a first switch in operable connection with the first center pin receptacle that is repositioned in response to the first center pin receptacle receiving a center pin of the coaxial connector that has a length greater than a threshold; and first circuitry disposed within the housing and electrically connected to the first switch, the first circuitry providing an external indication in response to the first switch being repositioned.

15. The device of claim 14, wherein the first coaxial connector jack has a concentric outer support surface concentrically engaging an outer side of the outermost conductive sleeve.

16. The device of claim 15, wherein the outer support surface of the first coaxial connector jack has longitudinal slots that accept barbs extending radially from the coaxial connector that limit rotation of the coaxial connector while allowing longitudinal movement of the coaxial connector.

17. The device of claim 14, wherein the first support shaft has a first pin entryway at a receiving end with a first diameter and the first pin receptacle has a diameter that is greater than or equal to the first diameter.

18. The device of claim 14, wherein the housing has a second aperture, the device further comprising:

a second coaxial connector jack disposed on one of the surfaces and passing through the second aperture, the second coaxial connector jack having a second center pin receptacle surrounded by a second support shaft, the second support shaft being sized to concentrically receive an inner side of the sleeve, the second coaxial connector also having a reference electrode; and second circuitry disposed within the housing and electrically connected to the second center pin receptacle and the reference electrode, wherein the second circuitry provides electrical power to the coaxial connector received by the second coaxial connector jack to determine whether the electrical resistance of the coaxial connector is within a predetermined range and to provide an external indication of the determination.

19. A device for testing a cable having a coaxial connector with a sleeve and a center pin, comprising a coaxial connector jack that comprises:

a first support shaft having a first pin entryway of a first diameter at a receiving end of the support shaft, the first support shaft being sized to receive an inner side of the sleeve;

a first center pin receptacle surrounded by the first support shaft, the first center pin receptacle having an inner diameter at a receiving end of the receptacle greater than or equal to the first diameter.

20. The device of claim 19, wherein the first coaxial connector jack has a concentric outer support surface sized to concentrically engage an outer side of the sleeve.

21. The device of claim 20, wherein the outer support surface of the first coaxial connector jack has longitudinal slots that accept barbs extending radially from the coaxial connector that limit rotation of the coaxial connector while allowing longitudinal movement of the coaxial connector.

22. The device of claim 19, wherein the first support shaft is an insulator.

23. The device of claim 19, wherein the first coaxial connector further comprises a reference electrode, the device further comprising:

a housing having opposing surfaces forming a housing interior, the housing having at least a first aperture, wherein the first coaxial connector jack is disposed on one of the surfaces and passes through the first aperture; and first circuitry disposed within the housing and electrically connected to the first center pin receptacle and the reference electrode, wherein the first circuitry provides electrical power to the coaxial connector received by the first coaxial connector jack to determine whether the electrical resistance of the coaxial connector is within a predetermined range and to provide an external indication of the determination.

24. The device of claim 19, further comprising:

a housing having opposing surfaces forming a housing interior, the housing having at least a first aperture, wherein the first coaxial connector jack is disposed on one of the surfaces and passes through the first aperture;

a first switch in operable connection with the first center pin receptacle that is repositioned in response to the first center pin receptacle receiving a center pin of the coaxial connector that has a length greater than a threshold; and first circuitry disposed within the housing and electrically connected to the first switch, the first circuitry providing an external indication in response to the first switch being repositioned.

25. A device for testing a cable having a coaxial connector with a sleeve and a center pin, comprising a coaxial connector jack that comprises:

a first support shaft being sized to receive an inner side of the sleeve;

a first center pin receptacle surrounded by the first support shaft; and a concentric outer support surface surrounding the first support shaft, the outer support surface being sized to concentrically engage an outer side of the sleeve, the outer support surface having longitudinal slots that accept barbs extending radially from the coaxial connector that limit rotation of the coaxial connector while allowing longitudinal movement of the coaxial connector.

26. The device of claim 25, wherein the first coaxial connector further comprises a reference electrode, the device further comprising:

a housing having opposing surfaces forming a housing interior, the housing having at least a first aperture, wherein the first coaxial connector jack is disposed on one of the surfaces and passes through the first aperture; and first circuitry disposed within the housing and electrically connected to the first center pin receptacle and the reference electrode, wherein the first circuitry provides electrical power to the coaxial connector received by the first coaxial connector jack to determine whether the electrical resistance of the coaxial connector is within a predetermined range and to provide an external indication of the determination.

27. The device of claim 25, further comprising:

a housing having opposing surfaces forming a housing interior, the housing having at least a first aperture, wherein the first coaxial connector jack is disposed on one of the surfaces and passes through the first aperture;

a first switch in operable connection with the first center pin receptacle that is repositioned in response to the first center pin receptacle receiving a center pin of the coaxial connector that has a length greater than a threshold; and first circuitry disposed within the housing and electrically connected to the first switch, the first circuitry providing an external indication in response to the first switch being repositioned.

28. The device of claim 25, wherein the first support shaft has a first pin entryway of a first diameter at a receiving end of the support shaft; and the first center pin receptacle has an inner diameter at a receiving end of the receptacle greater than or equal to the first diameter.

* * * * *